(12) United States Patent
Okumura et al.

(10) Patent No.: US 6,432,730 B2
(45) Date of Patent: Aug. 13, 2002

(54) PLASMA PROCESSING METHOD AND APPARATUS

(75) Inventors: Tomohiro Okumura; Takuya Matsui, both of Osaka-fu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/789,799

(22) Filed: Feb. 22, 2001

(30) Foreign Application Priority Data

Feb. 23, 2000 (JP) ........................................ 2000-045483

(51) Int. Cl.$^7$ ............................................... H01L 21/00
(52) U.S. Cl. ............................................ 438/9; 438/710
(58) Field of Search .............................. 438/9, 710, 711, 438/714, 715, 729, 730, 905

(56) References Cited

U.S. PATENT DOCUMENTS 5,587,205 A * 12/1996 Saito et al. .................. 427/553

FOREIGN PATENT DOCUMENTS

JP          8-83696          3/1996

* cited by examiner

*Primary Examiner*—Viet Q. Nguyen
*Assistant Examiner*—David Nhu
(74) *Attorney, Agent, or Firm*—Wenderoth, Lind & Ponack, L.L.P.

(57) ABSTRACT

A plasma processing method includes evacuating a vacuum chamber while supplying a gas into the vacuum chamber, thereby controlling an interior of the vacuum chamber to a pressure, and supplying a high frequency power of a frequency of 50 MHz–3 GHz to an antenna which is set opposite to a substrate placed to a substrate electrode in the vacuum chamber and which has a structure with a dielectric member held between a wall face of the vacuum chamber opposite to the substrate and a metallic plate, thereby generating plasma inside the vacuum chamber and processing the substrate, wherein the high frequency power is supplied to satisfy a relation $3r<c/(f\cdot\in^{1/2})<9r$ when c is a light velocity (m/sec), f is a frequency (Hz) of the high frequency power, $\in$ is a relative permittivity of the dielectric member and, r is a half (m) of a longer line of a shape of the dielectric member.

9 Claims, 7 Drawing Sheets

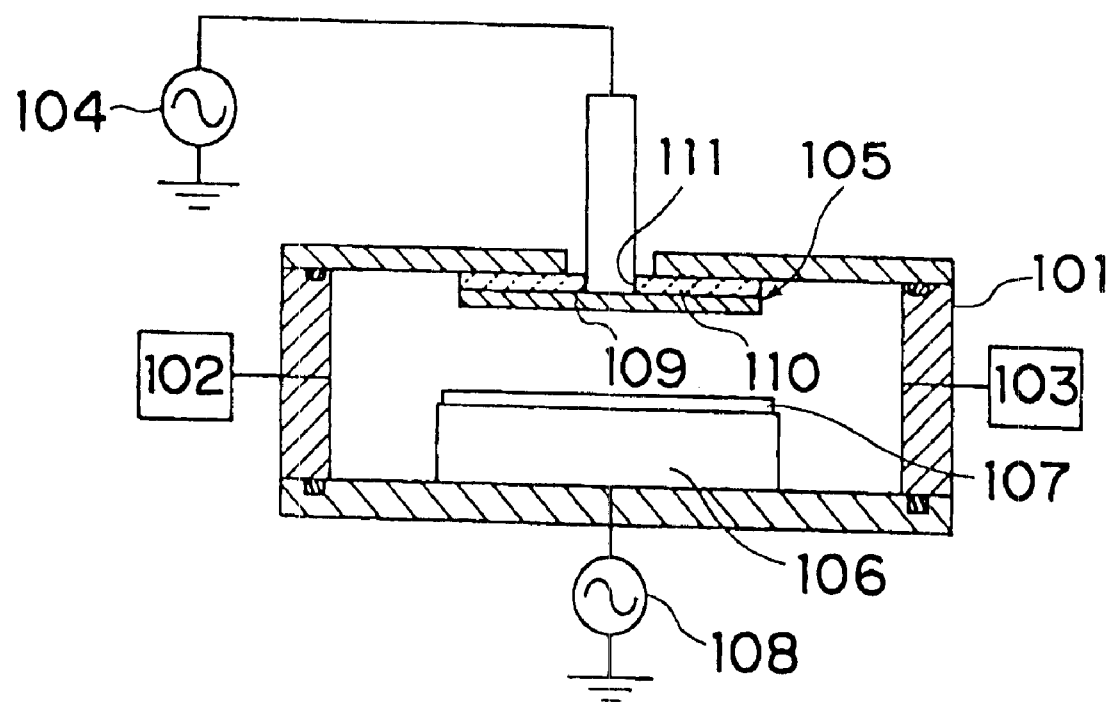
Fig.10 - PRIOR ART

PLASMA PROCESSING METHOD AND APPARATUS

BACKGROUND OF THE INVENTION

1. Field of the Invention

The present invention relates to a method and an apparatus for plasma processing such as dry etching, sputtering, plasma CVD, or the like utilized for manufacturing electronic devices and micromachines of a semiconductor or the like, and more particularly to the method and apparatus which utilize plasma excited with the use of a VHF or UHF-band high frequency power.

2. Description of the Related Art

Japanese Laid-Open Patent Publication No. 8-83696 describes that it is important to make use of high-density plasma to cope with finely forming electronic devices of a semiconductor or the like. In the meantime, low electron temperature plasma having a high electron density and a low electron temperature is attracting attention these days.

When a gas having a strong negative characteristic, in other words, easy to generate negative ions such as $Cl_2$, $SF_6$, or the like is turned to plasma and an electron temperature becomes approximately 3 eV or lower, a larger quantity of negative ions is generated than when the electron temperature is high. Utilizing this phenomenon can prevent an abnormality in shape in a type of etching called "notch" which is caused by positive charges piled to a bottom part of a fine pattern due to an excessive injection of positive ions, thus enabling highly accurate etching into remarkably fine patterns.

When a gas including carbon and fluorine such as CxFy, CxHyFz (x, y and z are natural numbers) or the like generally used to etch insulating films such as silicon oxide films or the like is turned to plasma, and if the electron temperature becomes approximately not higher than 3 eV, dissociation of the gas is restricted more than when the electron temperature is high, particularly, generation of F atoms, F radicals, and the like is suppressed. Since the F atoms, F radicals, and the like can be used to etch silicon fast, the insulating films can be etched with a higher etching selectivity to silicon as the electron temperature is lower.

A temperature of ions and a potential of plasma decrease when the electron temperature becomes not higher than 3 eV, so that ionic damage to substrates in plasma CVD can be reduced.

It is a plasma source using a VHF or UHF-band high frequency power that has received the most-recent attention as a technique to generate plasma of a low electron temperature.

FIG. 10 is a sectional view of a plasma processing apparatus of a plate-shaped antenna system. In FIG. 10, a vacuum chamber 101 is evacuated by a pump 103 as an evacuation device while a predetermined gas is introduced from a gas supply device 102 into the vacuum chamber 101. With the inside of the vacuum chamber 101 kept at a predetermined pressure, a high frequency power of 100 MHz is supplied from a high frequency power source 104 for antenna to an antenna 105. In consequence, plasma is generated in the vacuum chamber 101, processing a substrate 107 placed on a substrate electrode 106, for example, by etching, deposition, surface reforming, or the like manner. At this time, a high frequency power is also supplied from a high frequency power source 108 for substrate electrode to the substrate electrode 106 as shown in FIG. 10, whereby an ion energy reaching the substrate 107 can be controlled. The antenna 105 consists of a metallic plate 109 of a radius of 115 mm and a dielectric plate 110 of a radius of 115 mm, and is designed to supply a high frequency voltage to the metallic plate 109 via a through hole 111 formed near the center of the dielectric plate 110.

According to the prior art system shown in FIG. 10, it is difficult to obtain stable plasma of a high plasma density.

The present invention has for its object to provide a method and an apparatus whereby stable plasma of a high plasma density can be obtained, while eliminating the above-described issue in the prior art.

SUMMARY OF THE INVENTION

In accomplishing these and other aspects, according to a first aspect of the present invention, there is provided a plasma processing method comprising:

evacuating a vacuum chamber while supplying a gas into the vacuum chamber, thereby controlling an interior of the vacuum chamber to a pressure; and supplying a high frequency power of a frequency of 50 MHz–3 GHz to an antenna which is set opposite to a substrate placed at a substrate electrode in the vacuum chamber and which has a structure with a dielectric member held between a wall face of the vacuum chamber opposite to the substrate and a metallic plate, thereby generating plasma inside the vacuum chamber and processing the substrate, wherein the high frequency power is supplied to satisfy a relation $3r < c/(f \cdot \in^{1/2}) < 9r$ when c is a light velocity (m/sec), f is a frequency (Hz) of the high frequency power, $\in$ is a relative permittivity of the dielectric member, and r is a half (m) of a longer line of a shape of the dielectric member.

According to a second aspect of the present invention, there is provided a plasma processing method according to the first aspect, wherein in supplying the high frequency power of the frequency of 50 MHz–3 GHz to the antenna, the high frequency power is supplied to satisfy a relation $3r < c/(f \cdot \in^{1/2}) < 9r$ when c is a light velocity (m/sec), f is a frequency (Hz) of the high frequency power, $\in$ is a relative permittivity of the dielectric member, and r is a radius (m) of a circular shape of the dielectric member.

According to a third aspect of the present invention, there is provided a plasma processing method according to the first aspect, wherein in supplying the high frequency power of the frequency of 50 MHz–3 GHz to the antenna, the high frequency power is supplied to satisfy a relation $3r < c/(f \cdot \in^{1/2}) < 9r$ when c is a light velocity (m/sec), f is a frequency (Hz) of the high frequency power, $\in$ is a relative permittivity of the dielectric member and, r is a half (m) of a diagonal line of a rectangular shape of the dielectric member.

According to a fourth aspect of the present invention, there is provided a plasma processing method according to the first aspect, wherein in supplying the high frequency power of the frequency of 50 MHz–3 GHz to the antenna, the high frequency power is supplied to satisfy a relation $3r < c/(f \cdot \in^{1/2}) < 9r$ when c is a light velocity (m/sec), f is a frequency (Hz) of the high frequency power, $\in$ is a relative permittivity of the dielectric member and, r is a half (m) of a major axis of an ellipse shape of the dielectric member.

According to a fifth aspect of the present invention, there is provided a plasma processing method according to the first aspect, wherein in supplying the high frequency power of the frequency of 50 MHz–3 GHz to the antenna, the high frequency power is supplied to satisfy a relation $4r < c/(f \cdot \in^{1/2}) < 8r$ when c is a light velocity (m/sec), f is a frequency (Hz) of the high frequency power, ∈ is a relative permittivity of the dielectric member, and r is a half (m) of a longer line of a shape of the dielectric member.

According to a sixth aspect of the present invention, there is provided a plasma processing method according to the first aspect, wherein in supplying the high frequency power of the frequency of 50 MHz–3 GHz to the antenna, the high frequency power is supplied to satisfy a relation $5r<c/(f\cdot\in^{1/2})<7r$ when c is a light velocity (m/sec), f is a frequency (Hz) of the high frequency power, ∈ is a relative permittivity of the dielectric member, and r is a half (m) of a longer line of a shape of the dielectric member.

According to a seventh aspect of the present invention, there is provided a plasma processing method according to the first aspect, further comprising:

supplying a high frequency voltage to the metallic plate via a through hole formed in a vicinity of a center of the dielectric member; and short circuiting the metallic plate and the wall face of the vacuum chamber opposite to the substrate via through holes formed at a plurality of points different from the center and a periphery of the dielectric member.

According to an eighth aspect of the present invention, there is provided a plasma processing method according to the seventh aspect, wherein in shortcircuiting the metallic plate and the wall face of the vacuum chamber opposite to the substrate, each of the points is shortcircuited to the vacuum chamber while each of the points is almost isotropically arranged to the center of the antenna.

According to a ninth aspect of the present invention, there is provided a plasma processing method according to the first aspect, wherein in supplying the high frequency power of the frequency of 50 MHz–3 GHz to the antenna, the high frequency power is supplied to the antenna while a surface of the antenna is covered with an insulating cover.

According to a 10th aspect of the present invention, there is provided a plasma processing apparatus comprising:

a vacuum chamber;

a gas supply device for supplying a gas into the vacuum chamber;

an evacuation device for evacuating the vacuum chamber;

a substrate electrode used for placing a substrate in the vacuum chamber;

an antenna in a structure having a dielectric member held between a wall face of the vacuum chamber opposite to the substrate electrode and a metallic plate; and a high frequency power source capable of supplying a high frequency power of a frequency of 50 MHz–3 GHz to the antenna, the plasma processing apparatus being constituted to supply the high frequency power to satisfy a relation $3r<c/(f\cdot\in^{1/2})<9r$ wherein c is a light velocity (m/sec), f is a frequency (Hz) of the high frequency power, ∈ is a relative permittivity of the dielectric member and, r is a half (m) of a longer line of a shape of the dielectric member.

According to an 11th aspect of the present invention, there is provided a plasma processing apparatus according to the 10th aspect, wherein the plasma processing apparatus being constituted to supply the high frequency power to satisfy a relation $3r<c/(f\cdot\in^{1/2})<9r$ wherein c is a light velocity (m/sec), f is a frequency (Hz) of the high frequency power, ∈ is a relative permittivity of the dielectric member, and r is a radius (m) of a circular shape of the dielectric member.

According to a 12th aspect of the present invention, there is provided a plasma processing apparatus according to the 10th aspect, wherein the plasma processing apparatus is constituted to supply the high frequency power to satisfy a relation $3r<c/(f\cdot\in^{1/2})<9r$ wherein c is a light velocity (m/sec), f is a frequency (Hz) of the high frequency power, ∈ is a relative permittivity of the dielectric member, and r is a half (m) of a diagonal line of a rectangular shape of the dielectric member.

According to a 13th aspect of the present invention, there is provided a plasma processing apparatus according to the 10th aspect, wherein the plasma processing apparatus is constituted to supply the high frequency power to satisfy a relation $3r<c/(f\cdot\in^{1/2})<9r$ wherein c is a light velocity (m/sec), f is a frequency (Hz) of the high frequency power, ∈ is a relative permittivity of the dielectric member, and r is a half (m) of a major axis of an ellipse shape of the dielectric member.

According to a 14th aspect of the present invention, there is provided a plasma processing apparatus according to the 10th aspect, wherein the plasma processing apparatus is constituted to supply the high frequency power to satisfy a relation $3r<c/(f\cdot\in^{1/2})<9r$ wherein c is a light velocity (m/sec), f is a frequency (Hz) of the high frequency power, ∈ is a relative permittivity of the dielectric member, and r is a half (m) of a major axis of an ellipse shape of the dielectric member.

According to a 15th aspect of the present invention, there is provided a plasma processing apparatus according to the 10th aspect, wherein the plasma processing apparatus is constituted to supply the high frequency power to satisfy a relation $5r<c/(f\cdot\in^{1/2})<7r$ wherein c is a light velocity (m/sec), f is a frequency (Hz) of the high frequency power, ∈ is a relative permittivity of the dielectric member, and r is a half (m) of a longer line of a shape of the dielectric member.

According to a 16th aspect of the present invention, there is provided a plasma processing apparatus according to the 10th aspect, wherein a high frequency voltage is supplied to the metallic plate via a through hole formed is a vicinity of a center of the dielectric member, thereby shortcircuiting the metallic plate and the wall face of the vacuum chamber opposite to the substrate via through holes formed at a plurality of points different from the center and a periphery of the dielectric member.

According to a 17th aspect of the present invention, there is provided a plasma processing apparatus according to the 16th aspect, wherein each of the points to be shortcircuited to the vacuum chamber is almost isotropically arranged to the center of the antenna.

According to an 18th aspect of the present invention, there is provided a plasma processing apparatus according to the 10th aspect, wherein a surface of the antenna is covered with an insulating cover.

According to a 19th aspect of the present invention, there is provided a plasma processing apparatus according to the 10th aspect, wherein a ring and groove-shaped plasma trap is set between the antenna and vacuum chamber.

BRIEF DESCRIPTION OF THE DRAWINGS

These and other aspects and features of the present invention will become clear from the following description taken in conjunction with the preferred embodiments thereof with reference to the accompanying drawings, in which:

FIG. 10 is a sectional view showing a structure of a plasma processing apparatus employed in a first embodiment of a conventional example;

DETAILED DESCRIPTION OF THE PREFERRED EMBODIMENTS

Figure 1:
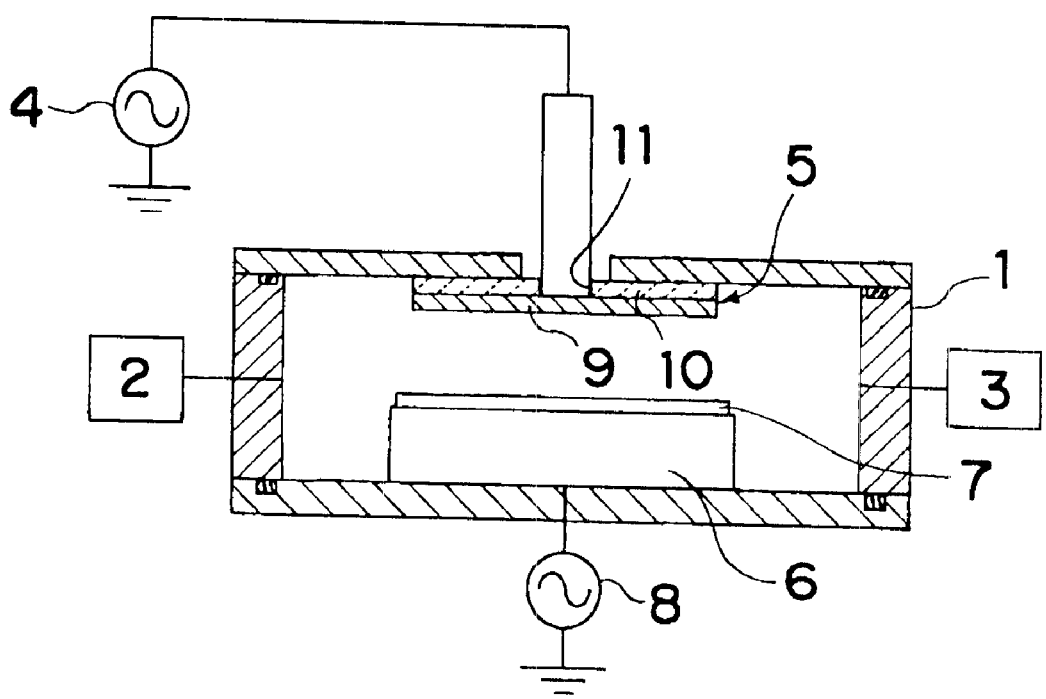
FIG. 1 is a sectional view showing a structure of a plasma processing apparatus employed in a first embodiment of the present invention.

Before the description of the present invention proceeds, it is to be noted that like parts are designated by like reference numerals throughout the accompanying drawings.

A first embodiment of the present invention will be described below with reference to FIG. 1.

FIG. 1 is a sectional view of a plasma processing apparatus of a plate-shaped antenna system according to the first embodiment of the present invention. In FIG. 1, a vacuum chamber 1 is evacuated by a pump 3 as an evacuation device while a predetermined gas is introduced from a gas supply device 2 into the vacuum chamber. With an inside of the vacuum chamber 1 kept at a predetermined pressure, a high frequency power of 100 MHz is supplied from a high frequency power source 4 for antenna to an antenna 5. In consequence, plasma is generated in the vacuum chamber 1, processing a substrate 7 placed on a substrate electrode 6, for example, by etching, deposition, surface reforming or the like manner. At this time, a high frequency power is also supplied from a high frequency power source 8 for substrate electrode to the substrate electrode 6 as shown in FIG. 1, whereby an ion energy reaching the substrate 7 can be controlled. The antenna 5 consists of a metallic plate 9 of a radius of 115 mm and a dielectric plate 10 of a radius of 115 mm, and is designed to supply a high frequency voltage to the metallic plate 9 via a through hole 11 formed near the center of the dielectric plate 10.

Figure 2:
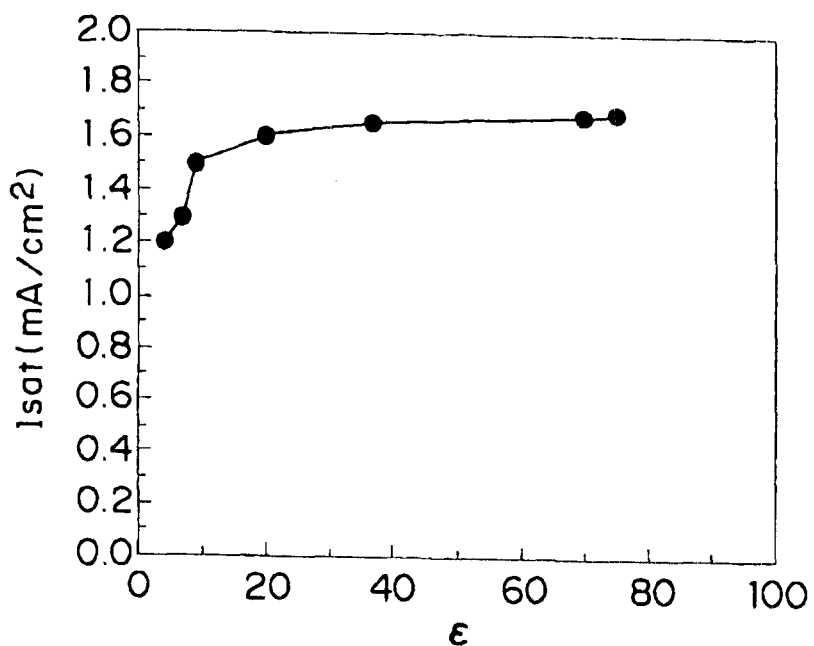
FIG. 2 is a diagram showing measured results of an ion saturation current density immediately above a substrate with a relative permittivity of a dielectric plate changed from 4 to 90.

When a relative permittivity of a dielectric plate 10 is changed from 4 to 90 while a plasma generation condition is fixed so that a gas is $Cl_2$, a flow rate of the gas is 100 sccm, a pressure is 1.3 Pa, and a high frequency power for antenna is 1 kW, an ion saturation current density measured immediately above a substrate 7 is as indicated in FIG. 2. It is clear from FIG. 2 that the ion saturation current density decreases when the relative permittivity of the dielectric plate 10 is approximately 8 or smaller. When the relative permittivity of the dielectric plate 10 is larger than approximately 80, the plasma becomes unstable and the ion saturation current density cannot be measured.

Generally, supposing that a light velocity is c(m/sec) and a frequency of electromagnetic waves is f(Hz), a wavelength $\lambda$(m) of electromagnetic waves in a medium of a relative permittivity of $\in$ is expressed by:

$$\lambda = c/(f \cdot \in^{1/2})$$

That is, the wavelength $\lambda$ is inversely proportional to the relative permittivity $\in^{1/2}$. Since an outer circumferential part of the dielectric plate 10 which is an exit for electromagnetic waves from the antenna 5 is a free end, an electric field strength is weak in the vicinity of the center in the dielectric plate 10, whereas the electric field strength is strong at the outer circumferential part. In order to enhance the electric field strength at the outer circumferential part, it is effective to reduce the wavelength in the dielectric plate 10 thereby increasing a phase difference to the vicinity of the center. Thus, an increase in relative permittivity of the dielectric plate 10 is considered to increase the electric field strength at the outer circumferential part of the dielectric plate 10, with a high ion saturation current density effectuated.

On the other hand, if the relative permittivity of the dielectric plate 10 is increased too much, the wavelength in the dielectric plate 10 is shortened too much, letting an electromagnetic field of a high-order mode to the dielectric plate 10 to be allowed and result in a mix state with a fundamental mode, The plasma becomes unstable consequently.

The above result indicates it necessary to set the relative permittivity of the dielectric plate 10 within some range so as to obtain stable plasma of a high plasma density. Since the frequency f of the high frequency power for antenna is 100 MHz=100,000,000 Hz and the radius r of the dielectric plate 10 is 115 mm=0.115 m, stable plasma of a high plasma density can be obtained by selecting each of the parameters to satisfy the following relation:

$$3r < c/(f \cdot \in^{1/2}) < 9r$$

In the embodiment of the present invention described above, a shape of the vacuum chamber, a shape and an arrangement of the antenna, a shape and an arrangement of the dielectric body, and the like are shown merely by way of example among variations within the scope of the present invention. Variations other than the example can naturally be conceivable in adopting the present invention.

Figure 3:
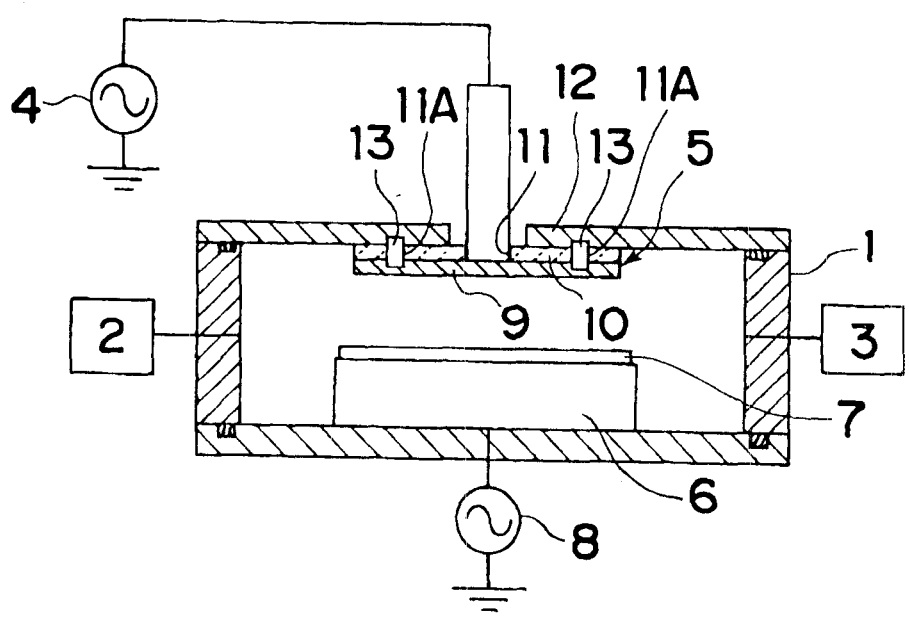
FIG. 3 is a sectional view showing a structure of a plasma processing apparatus used in a second embodiment of the present invention.

The high frequency voltage is supplied in the metallic plate 9 through the through hole 11 formed to the vicinity of the center of the dielectric plate 10 according to the first embodiment of the present invention. However, an arrangement as in a second embodiment of the present invention shown in FIG. 3 is applicable, in which the high frequency voltage is supplied to the metallic plate 9 via the through hole 11 set in the vicinity of the center of the dielectric plate 10, and moreover, the metallic plate 9 and a wall face 12 of the vacuum chamber opposite to the substrate 7 are short-circuited by shortcircuit pins 13 via through holes 11A formed in a plurality of points other than the center and the periphery of the dielectric plate 10. In this arrangement, an anisotropic mode among the fundamental mode of the electromagnetic field radiated from the antenna 5 can be effectively restricted. Preferably, each of points to be short-circuited to the vacuum chamber 1 is nearly isotropically arranged to the center of the antenna 5 so as to obtain a better effect, for example, uniform distribution of the plasma. When a substrate with a different pattern is used or when the plasma density is changed, the points may not be isotropically arranged thereto.

Figure 4:
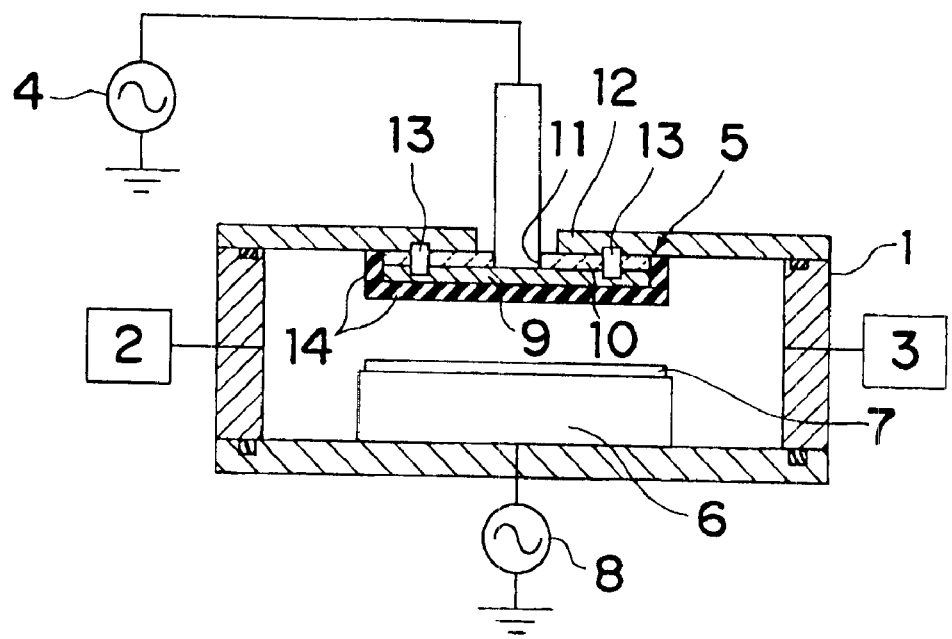
FIG. 4 is a sectional view showing a structure of a plasma processing apparatus used in a third embodiment of the present invention.

Although a surface of the antenna 5 is exposed to the plasma in the structure of the above first embodiment, the surface of the antenna 5 may be coated with an insulating cover 14 made of quartz glass, ceramic, or the like as in a third embodiment of the present invention shown in FIG. 4. The substrate 7 would be probably contaminated by a material constituting the antenna 5, or the like trouble would be brought about without the insulating cover 14. Therefore, the insulating cover 14 is preferably provided if processing sensitive to contamination is to be carried out. On the other hand, a ratio of capacitive coupling between the metallic plate 9 and plasma tends to increase in the absence of the insulating cover 14 thereby increasing the plasma density at a central part of the substrate 7. Therefore, depending on a type and a pressure of the gas to be used, a uniform plasma distribution may rather be obtained by eliminating the insulating cover 14.

Figure 5:
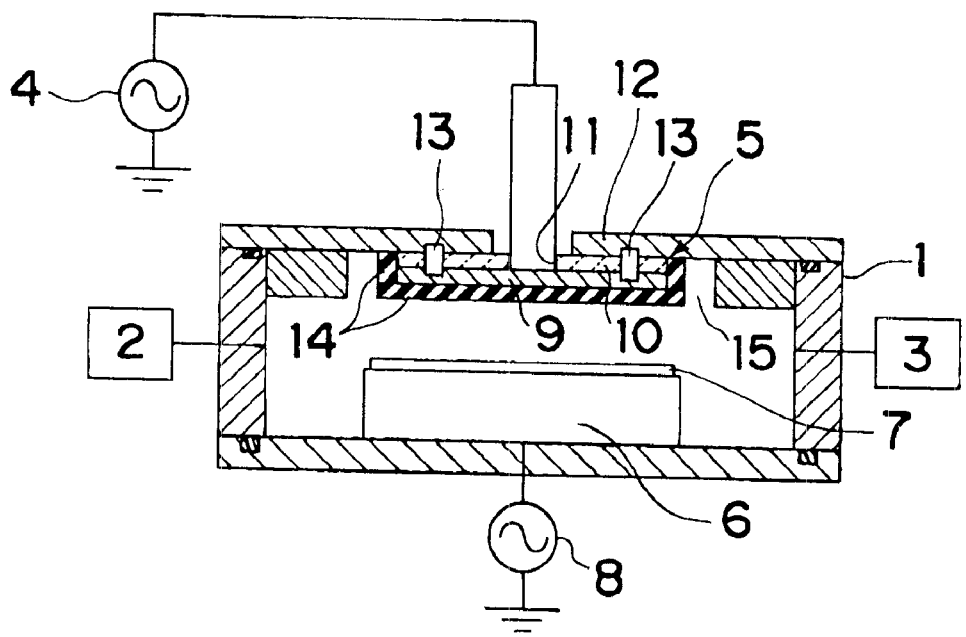
FIG. 5 is a sectional view showing a structure of a plasma processing apparatus used in a fourth embodiment of the present invention.

While each of the foregoing embodiments relates to the case where a space surrounded by a solid surface is not present in the vicinity of the antenna 5, a ring and groove-shaped plasma trap 15 may be set between the antenna 5 and the vacuum chamber 1 according to a fourth embodiment of the present invention represented in FIG. 5. In this constitution, the plasma trap 15 surrounded by the solid surface enhances electromagnetic waves radiated from the antenna 5 and facilitates generation of high-density plasma (hollow cathode discharge) because the hollow cathode discharge is apt to take place with the low electron temperature plasma. The plasma density is rendered highest at the plasma trap 15 in the vacuum chamber 1. The plasma is transported to the vicinity of the substrate 7 through diffusion. More uniform plasma can be obtained accordingly.

While a direct current magnetic field is not present in the vacuum chamber in each of the above embodiments of the present invention, the present invention is effective also in the case where such a large direct current magnetic field as enables the high frequency power to invade into the plasma is not present, for instance, when a small direct current magnetic field of approximately several tens of Gauss is used to improve inflammability. However, the present invention is particularly effective in the case where the direct current magnetic field is not present in the vacuum chamber.

The high frequency power of 100 MHz is supplied to the antenna in each of the above embodiments. However, the frequency is not limited to this and the present invention is effective for a plasma processing method and apparatus using the frequency of 50 MHz–3 GHz.

Figure 6:
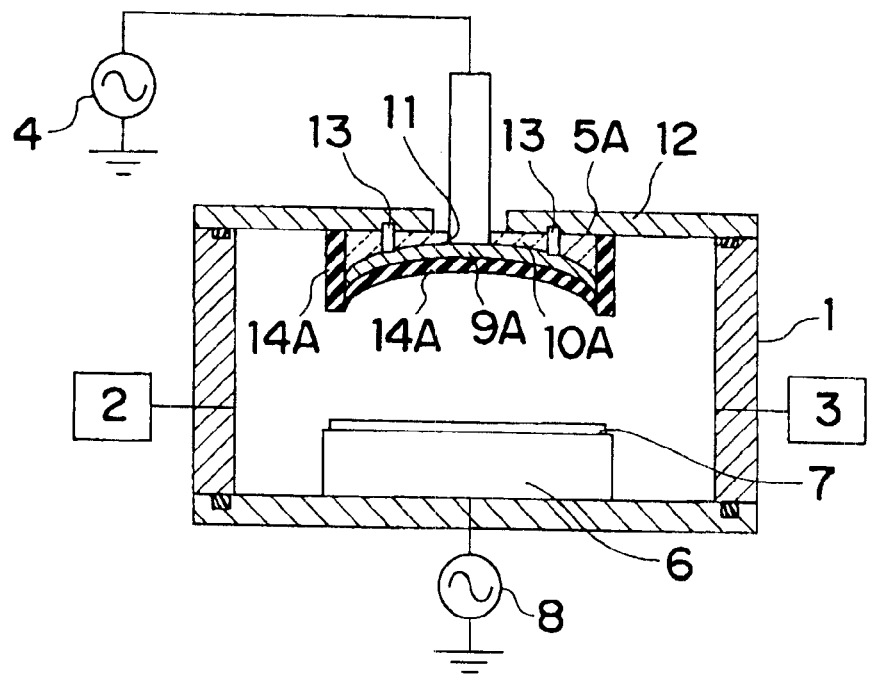
FIG. 6 is a sectional view showing a structure of a plasma processing apparatus used in a fifth embodiment of the present invention.
Figure 7:
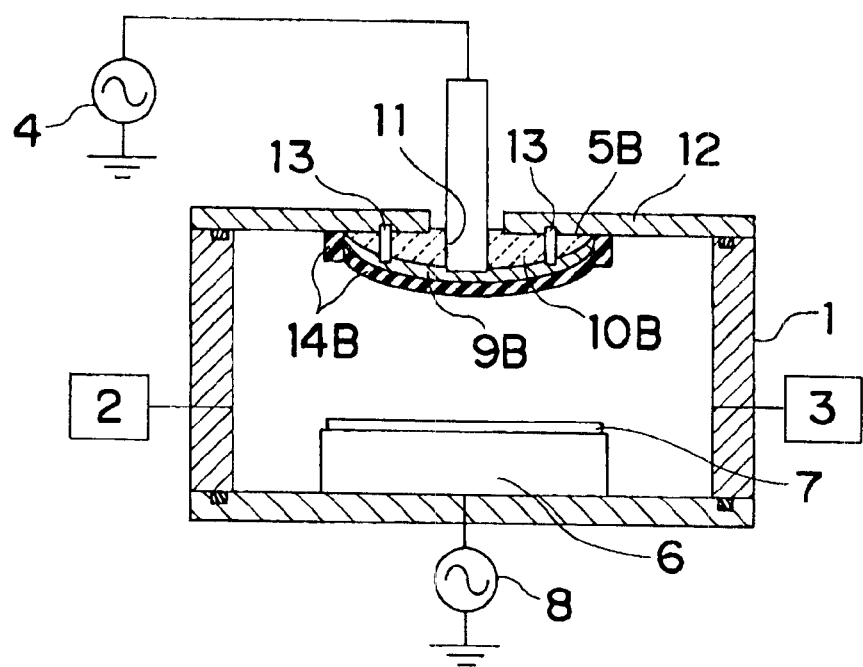
FIG. 7 is a sectional view showing a structure of a plasma processing apparatus used in a sixth embodiment of the present invention.

Although the antenna is a flat plate in each of the above-discussed embodiments, the antenna can be a recessed dome-shaped antenna 5A projecting opposite to the substrate 7 as in a fifth embodiment of the present invention of FIG. 6, the antenna having a recessed dome-shaped metallic plate 9A, a recessed dome-shaped dielectric plate 10A, and a recessed dome-shaped insulating cover 14A. Further, the antenna can be a dome-shaped antenna 5B projecting toward the substrate 7 as in a sixth embodiment of the present invention shown in FIG. 7, the antenna having a projected dome-shaped metallic plate 9B, a projected dome-shaped dielectric plate 10B, and a projected dome-shaped insulating cover 14B.

Figure 8:
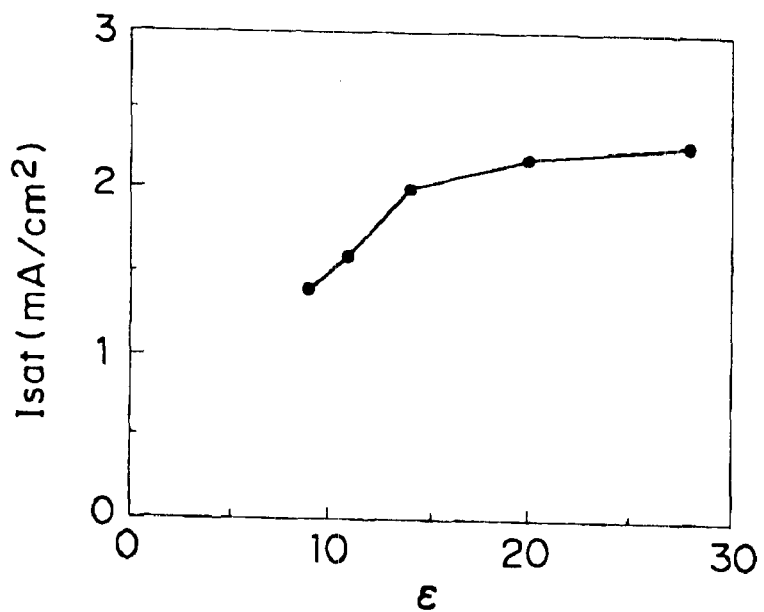
FIG. 8 is a diagram showing measured results of an ion saturation current density immediately above a substrate with a relative permittivity of a dielectric plate changed from 14 to 28.

FIG. 8 is a diagram showing measured results of an ion saturation current density immediately above a substrate with the relative permittivity of the dielectric plate changed from 14 to 28 under conditions similar to those of FIG. 2 except for the pressure, That is, when the relative permittivity of the dielectric plate 10 is changed from 14 to 28 while a plasma generation condition is fixed so that a gas is $Cl_2$, a flow rate of the gas is 100 sccm, a pressure is 0.3 Pa, and a high frequency power for antenna is 1 kW, the ion saturation current density measured immediately above the substrate 7 is indicated in FIG. 8. It is clear from FIG. 8 that the ion saturation current density decreases when the relative permittivity of the dielectric plate 10 is approximately 14 or smaller. When the relative permittivity of the dielectric plate 10 is approximately 28 or larger, the plasma becomes unstable and the ion saturation current density cannot be measured. The above result indicates that since the frequency f of the high frequency power for antenna is 100 MHz=100,000,000 Hz and the radius r of the dielectric plate 10 is 115 mm=0.115 m, stable plasma of a high plasma density can be obtained by selecting each of the parameters to satisfy the following relation:

$$5r < c/(f \cdot \epsilon^{1/2}) < 7r$$

Figure 9:
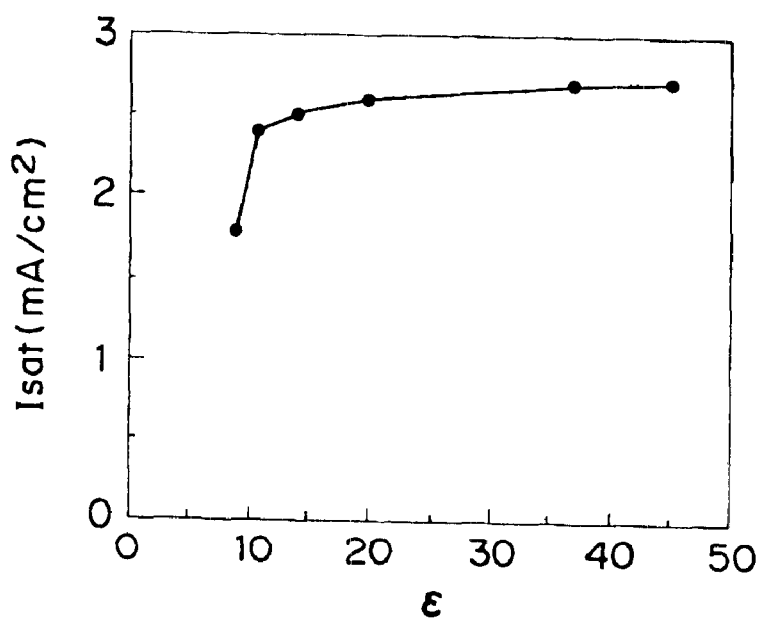
FIG. 9 is a diagram showing measured results of an ion saturation current density immediately above a substrate with a relative permittivity of a dielectric plate changed from 11 to 45.

On the other hand, FIG. 9 is a diagram showing measured results of an ion saturation current density immediately above a substrate with the relative permittivity of the dielectric plate changed from 11 to 45 under conditions similar to those of FIG. 2 except for the pressure, When the relative permittivity of the dielectric plate 10 is changed from 11 to 45 while a plasma generation condition is fixed so that a gas is $Cl_2$, a flow rate of the gas is 100 sccm, a pressure is 0.8 Pa, and a high frequency power for antenna is 1 kW, the ion saturation current density measured immediately above the substrate 7 is indicated in FIG. 9. It is clear from FIG. 9 that the ion saturation current density decreases when the relative permittivity of the dielectric plate 10 is approximately 11 or smaller. When the relative permittivity of the dielectric plate 10 is approximately 45 or larger, the plasma becomes unstable and the ion saturation current density cannot be measured. The above result indicates that since the frequency f of the high frequency power for antenna is 100 MHz=100,000,000 Hz and the radius r of the dielectric plate 10 is 15 mm=0.115 m, stable plasma of a high plasma density can be obtained by selecting each of the parameters to satisfy the following relation:

$$4r < c/(f \cdot \epsilon^{1/2}) < 8r$$

As a result of the examples, in order to obtain stable plasma of a high plasma density, each of the parameters is selected to satisfy the following relation: $5r < c/(f \cdot \epsilon^{1/2}) < 7r$ as a best example, $4r < c/(f \cdot \epsilon^{1/2}) < 8r$ as a better example, and $3r < c/(f \cdot \epsilon^{1/2}) < 9r$ as a good example, That is, although depending on the pressure, the kind of gas, high frequency power for antenna, or the like, the range for obtaining stable plasma of a high plasma density may be changed, the ranges of $3r < c/(f \cdot \epsilon^{1/2}) < 9r$, $4r < c/(f \cdot \epsilon^{1/2}) < 8r$, and $5r < c/(f \cdot \epsilon^{1/2}) < 7r$ may be applied to gas such as Ar, $N_2$, or the like because it seems that the range is not greatly changed by the kind of gas.

In each of the foregoing embodiments, the dielectric plate is one example of a dielectric member and is not limited to be a plate, but may be formed of a sheet.

Figure 11A:
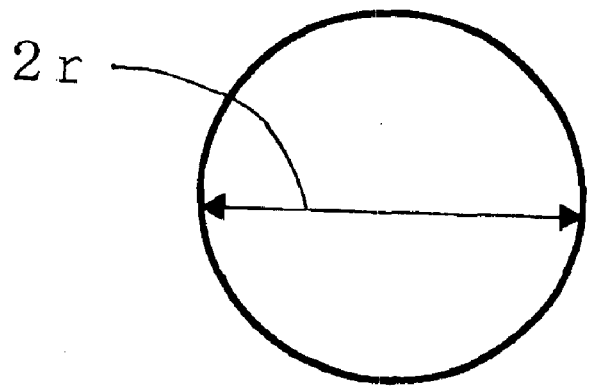
FIG. 11A is a plan view of the dielectric plate having a circular shape.
Figure 11B:
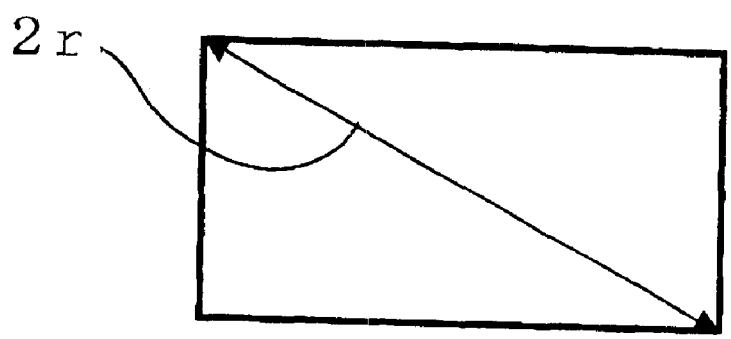
FIG. 11B is a plan view of a dielectric plate having a rectangular shape.
Figure 11C:
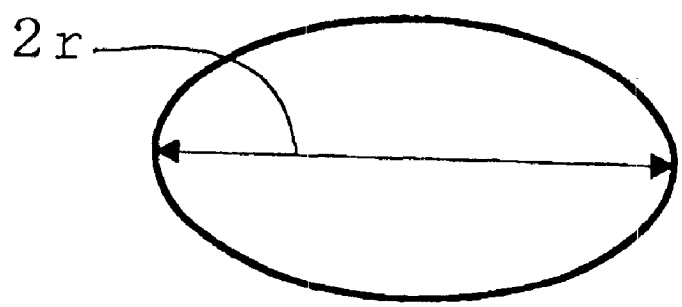
FIG. 11C is a plan view of a dielectric plate having an ellipse shape.

In each of the foregoing embodiments, the dielectric plate has a circular shape, but is not limited to be in such a shape, The dielectric plate may have a rectangular shape or an ellipse shape, In such a case, r is a half of a diagonal line of a rectangular shape as shown in FIG. 11B or a half of a major axis of an ellipse shape as shown in FIG. 11C, instead of a radius (m) of a circular shape of the dielectric plate as shown in FIG. 11A in this specification and claims. In the other words, r is a half of a longer line of a shape of the dielectric plate, As is apparent from the foregoing description, according to the plasma processing method of the present invention, the vacuum chamber is evacuated while a gas is supplied into the vacuum chamber, thereby controlling the interior of the vacuum chamber to a predetermined pressure, In this state, the high frequency power of a frequency of 50 MHz–3 GHz is supplied to the antenna set opposite to the substrate placed at the substrate electrode in the vacuum chamber in the structure in which the dielectric plate is held between the metallic plate and the wall face of the vacuum chamber opposite to the substrate, whereby plasma is generated in the vacuum chamber thereby processing the substrate, If the light velocity is c(m/sec), the frequency of the high frequency power is f(Hz), the relative permittivity of the dielectric plate is $\in$, and the radius of the dielectric plate is r(m), the high frequency power is supplied to satisfy the relation:

$$3r<c/(f\cdot\in^{1/2})<9r.$$

Accordingly, stable plasma of a high plasma density can be obtained, so that the substrate can be stably processed at high speed.

The plasma processing apparatus of the present invention comprises the vacuum chamber, the gas supply device for supplying a gas into the vacuum chamber, the evacuation device for evacuating the interior of the vacuum chamber, the substrate electrode used for placing the substrate in the vacuum chamber, the antenna in the structure with the dielectric plate held between the metallic plate and the wall face of the vacuum chamber opposite to the substrate electrode, and the high frequency power source which can supply the high frequency power of the frequency of 50 MHz–3 GHz to the antenna. If the light velocity is c(m/sec), the frequency of the high frequency power is f(Hz), the relative permittivity of the dielectric plate is $\in$, and the radius of the dielectric plate is r(m), the apparatus is designed to supply the high frequency power to satisfy the relation:

$$3r<c/(f\cdot\in^{1/2})<9r.$$

Accordingly, the apparatus can obtain stable plasma of a high plasma density and stably process the substrate at high speed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method comprising:
   evacuating a vacuum chamber while supplying a gas into the vacuum chamber, thereby controlling an interior of the vacuum chamber to a pressure; and
   supplying a high frequency power of a frequency of 50 MHz–3 GHz to an antenna which is set opposite to a substrate placed at a substrate electrode in the vacuum chamber and which has a structure with a dielectric member held between a wall face of the vacuum chamber opposite to the substrate and a metallic plate, thereby generating plasma inside the vacuum chamber and processing the substrate,
   wherein the high frequency power is supplied to satisfy a relation $3r<c/(f\cdot\in^{1/2})<9r$ when c is a light velocity (m/sec), f is a frequency (Hz) of the high frequency power, $\in$ is a relative permittivity of the dielectric member, and r is a half (m) of a longer line of a shape of the dielectric member.

2. A plasma processing method according to claim 1, wherein in supplying the high frequency power of the frequency of 50 MHz–3 GHz to the antenna, the high frequency power is supplied to satisfy a relation $3r<c/(f\cdot\in^{1/2})<9r$ when c is a light velocity (m/sec), f is a frequency (Hz) of the high frequency power, $\in$ is a relative permittivity of the dielectric member, and r is a radius (m) of a circular shape of the dielectric member.

3. A plasma processing method according to claim 1, wherein in supplying the high frequency power of the frequency of 50 MHz–3 GHz to the antenna, the high frequency power is supplied to satisfy a relation $3r<c/(f\cdot\in^{1/2})<9r$ when c is a light velocity (m/sec), f is a frequency (Hz) of the high frequency power, $\in$ is a relative permittivity of the dielectric member, and r is a half (m) of a diagonal line of a rectangular shape of the dielectric member.

4. A plasma processing method according to claim 1, wherein in supplying the high frequency power of the frequency of 50 MHz–3 GHz to the antenna, the high frequency power is supplied to satisfy a relation $3r<c/(f\cdot\in^{1/2})<9r$ when c is a light velocity (m/sec), f is a frequency (Hz) of the high frequency power, $\in$ is a relative permittivity of the dielectric member, and r is a half (m) of a major axis of an ellipse shape of the dielectric member.

5. A plasma processing method according to claim 1, wherein in supplying the high frequency power of the frequency of 50 MHz–3 GHz to the antenna, the high frequency power is supplied to satisfy a relation $4r<c/(f\cdot\in^{1/2})<8r$ when c is a light velocity (m/sec), f is a frequency (Hz) of the high frequency power, $\in$ is a relative permittivity of the dielectric member, and r is a half (m) of a longer line of a shape of the dielectric member.

6. A plasma processing method according to claim 1, wherein in supplying the high frequency power of the frequency of 50 MHz–3 GHz to the antenna, the high frequency power is supplied to satisfy a relation $5r<c/(f\cdot\in^{1/2})<7r$ when c is a light velocity (m/sec), f is a frequency (Hz) of the high frequency power, $\in$ is a relative permittivity of the dielectric member, and r is a half (m) of a longer line of a shape of the dielectric member.

7. A plasma processing method according to claim 1, further comprising:
   supplying a high frequency voltage to the metallic plate via a through hole formed in a vicinity of a center of the dielectric member; and
   shortcircuiting the metallic plate and the wall face of the vacuum chamber opposite to the substrate via through holes formed at a plurality of points different from the center and a periphery of the dielectric member.

8. A plasma processing method according to claim 7, wherein in shortcircuiting the metallic plate and the wall face of the vacuum chamber opposite to the substrate, each of the points is shortcircuited to the vacuum chamber while each of the points is almost isotropically arranged to the center of the antenna.

9. A plasma processing method according to claim 1, wherein in supplying the high frequency power of the frequency of 50 MHz–3 GHz to the antenna, the high frequency power is supplied to the antenna while a surface of the antenna is covered with an insulating cover.

* * * * *